(12) United States Patent
Shikano et al.

(10) Patent No.: US 12,538,811 B2
(45) Date of Patent: Jan. 27, 2026

(54) SEMICONDUCTOR DEVICE COMPRISING AN ELECTRODE TERMINAL AND AN ELECTRODE EXPOSED IN AN OPENING PROVIDED IN A MOLD RESIN, SEMICONDUCTOR DEVICE GROUP COMPRISING AN ELECTRODE TERMINAL AND AN ELECTRODE EXPOSED IN AN OPENING PROVIDED IN A MOLD RESIN, AND POWER CONVERSION APPARATUS COMPRISING AN ELECTRODE TERMINAL AND AN ELECTRODE EXPOSED IN AN OPENING PROVIDED IN A MOLD RESIN

(71) Applicant: Mitsubishi Electric Corporation, Tokyo (JP)

(72) Inventors: Taketoshi Shikano, Tokyo (JP); Kotaro Nishihara, Tokyo (JP); Kiyoshi Arai, Tokyo (JP); Shinya Soneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 319 days.

(21) Appl. No.: 18/185,865

(22) Filed: Mar. 17, 2023

(65) Prior Publication Data

US 2023/0411253 A1    Dec. 21, 2023

(30) Foreign Application Priority Data

Jun. 20, 2022  (JP) .................................. 2022-098596

(51) Int. Cl.
*H01L 23/495*    (2006.01)
*H01L 21/56*    (2006.01)
(Continued)

(52) U.S. Cl.
CPC ...... *H01L 23/49548* (2013.01); *H01L 21/565* (2013.01); *H01L 23/3107* (2013.01); *H01L 23/49562* (2013.01); *H02M 7/53875* (2013.01)

(58) Field of Classification Search
CPC .................. H02M 7/003; H01L 23/49548
(Continued)

(56) References Cited

U.S. PATENT DOCUMENTS 8,502,385 B2   8/2013  Oka et al.
2004/0089928 A1   5/2004  Nakajima et al.
(Continued)

FOREIGN PATENT DOCUMENTS

JP   H01-116421 U   8/1989
JP   2004-165281 A   6/2004
(Continued)

OTHER PUBLICATIONS

"Notice of Reasons for Refusal" Office Action issued in JP 2022-098596; mailed by the Japanese Patent Office on Feb. 4, 2025.
"Notice of Reasons for Refusal" Office Action issued in DE 102023111539.1; mailed by the German Patent Office on Oct. 22, 2025.

*Primary Examiner* — Quoc D Hoang
(74) *Attorney, Agent, or Firm* — Studebaker Brackett PLLC

(57) ABSTRACT

Even if there is a change in the shape of a transfer mold power module is required, a change in a position of the electrode of the module is facilitated by separating electrode terminals of a power module from the electrodes and retrofitting the separated electrode terminals to the electrodes with high precision. A semiconductor device includes a mold resin enclosing a semiconductor chip, an electrode electrically connected to the semiconductor chip and exposed in an opening provided in the mold resin, and an electrode terminal having a contact portion that covers the electrode and is in electrical contact with the electrode, a (Continued)

plurality of projections formed to surround the contact portion and provided between a side surface of the opening and the contact portion, a contact end portion having the contact portion and an open end portion which is a different end portion from the contact end portion.

19 Claims, 26 Drawing Sheets

(51) Int. Cl.
    *H01L 23/31*    (2006.01)
    *H02M 7/5387*    (2007.01)

(58) Field of Classification Search
    USPC .......................................................... 257/676
    See application file for complete search history.

(56) References Cited

U.S. PATENT DOCUMENTS

| | | |
|---|---|---|
| 2012/0098138 A1 | 4/2012 | Oka et al. |
| 2015/0091164 A1* | 4/2015 | Yamagami ............. H01L 24/06 |
| | | 257/737 |

FOREIGN PATENT DOCUMENTS

| | | |
|---|---|---|
| JP | 2008-118010 A | 5/2008 |
| JP | 2008-235651 A | 10/2008 |
| JP | 2011-077280 A | 4/2011 |
| JP | 2012-089681 A | 5/2012 |

* cited by examiner

F I G. 2 6
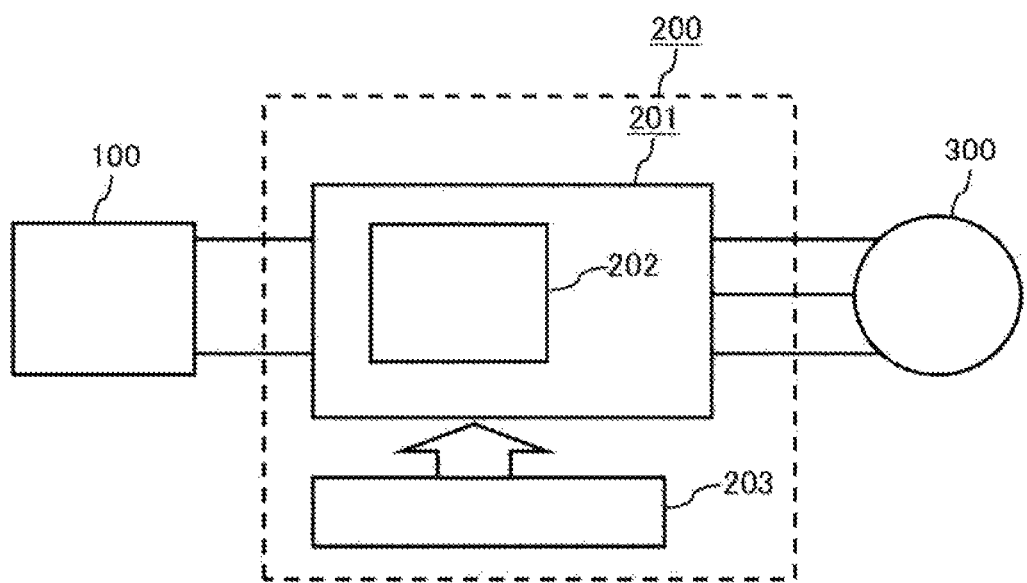

SEMICONDUCTOR DEVICE COMPRISING AN ELECTRODE TERMINAL AND AN ELECTRODE EXPOSED IN AN OPENING PROVIDED IN A MOLD RESIN, SEMICONDUCTOR DEVICE GROUP COMPRISING AN ELECTRODE TERMINAL AND AN ELECTRODE EXPOSED IN AN OPENING PROVIDED IN A MOLD RESIN, AND POWER CONVERSION APPARATUS COMPRISING AN ELECTRODE TERMINAL AND AN ELECTRODE EXPOSED IN AN OPENING PROVIDED IN A MOLD RESIN

BACKGROUND OF THE INVENTION

Field of the Invention

The present disclosure relates to a semiconductor device such as a transfer mold power module in which electrode terminals are retrofitted to electrodes.

Description of the Background Art

A power semiconductor device in which a plurality of lead frames are electrically connected to a power semiconductor chip sealed in a mold resin and, in which the plurality of lead frames protrude from a housing sealed with the mold resin together with the power semiconductor chip have been disclosed (see, for example, Japanese Patent Application Laid-Open No. 2004-165281 (paragraphs 0031 to 0034 and FIG. 1)).

When producing a transfer molded power module (TPM), the positions of the electrodes are fixed inside the mold of the transfer molded power module. If the electrode position of the module is changed, the shape change in the transfer mold power module is to be required. For this reason, there has been a problem that the changes in the shapes of the metal mold and the frame for producing the electrode corresponding to the metal mold and the overall manufacturing process are required, which entails extra cost.

SUMMARY

An object of the present disclosure is to provide a semiconductor device in which a change in a position of the electrode of the module is facilitated by separating electrode terminals of a power module from the electrodes and retrofitting the separated electrode terminals to the electrodes with high precision.

According to the present disclosure, a first semiconductor device includes a semiconductor chip, a mold resin, an electrode, and an electrode terminal. The mold resin encloses the semiconductor chip. The electrode is electrically connected to the semiconductor chip and exposed in an opening provided in the mold resin. The electrode terminal has a contact portion, a plurality of projections, a contact end portion, and an open end portion. The contact portion covers the electrode and is in electrical contact with the electrode. The plurality of projections are formed as to surround the contact portion and are provided between a side surface of the opening and the contact portion. The contact end portion has a contact portion. The open end portion is an end portion of the electrode terminal different from the contact end portion.

The first semiconductor device according to the present disclosure has a plurality of projections in the electrode terminal. Hence, the electrode terminal can be precisely positioned and mounted with respect to the electrode by external form bonding between the side surface of the opening and the electrode terminal having the projection. As a result, the change in an electrode position of the module can be easily conducted.

A second semiconductor device according to the present disclosure includes a semiconductor chip, a mold resin, an electrode, and an electrode terminal. The mold resin encloses the semiconductor chip. The electrode is electrically connected to the semiconductor chip and exposed in an opening provided in the mold resin. The electrode terminal has a contact portion, a contact end portion, and an open end portion. The contact portion covers the electrode and is in electrical contact with the electrode. The contact end portion has a contact portion. The open end portion is an end portion of the electrode terminal different from the contact end portion. The mold resin has a plurality of projections between a side surface of the opening and the contact portion of the electrode terminal.

The second semiconductor device according to the present disclosure has a plurality of projections in the mold resin. Hence, the positioning precision of the electrode terminal with respect to the electrode improves. As a result, the change in an electrode position of the module can be easily conducted.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 26 is a diagram illustrating a power conversion system to which a power conversion apparatus according to a ninth embodiment is applied.

DESCRIPTION OF THE PREFERRED EMBODIMENTS

First Embodiment

Figure 1:
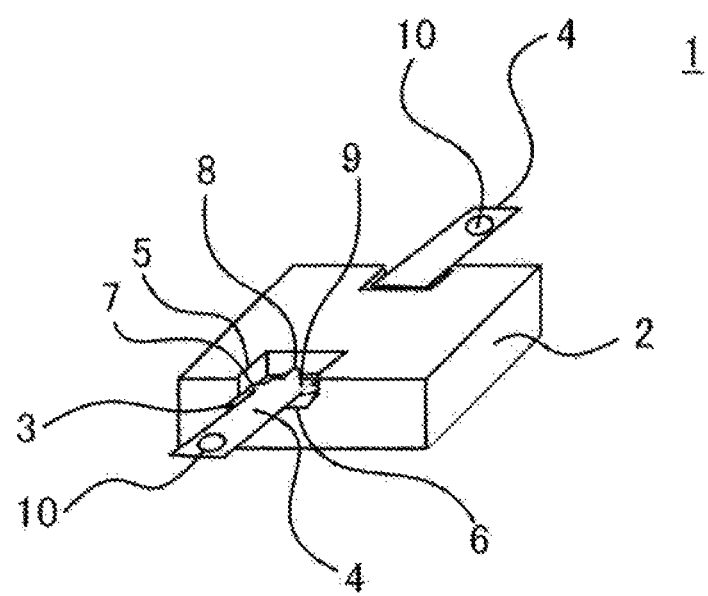
FIG. 1 is a perspective view of a semiconductor device according to a first embodiment.

A semiconductor device according to a first embodiment will be described with reference to FIG. 1. FIG. 1 is a perspective view of the semiconductor device according to the first embodiment. The semiconductor device according to the first embodiment is a transfer mold module. The transfer mold module is represented, for example, by a module formed by fixing a semiconductor chip and electrodes connected to the semiconductor chip in a mold, and pouring a mold resin into the mold which is subjected to curing.

As illustrated in FIG. 1, the semiconductor device 1 includes a semiconductor chip (not illustrated), a mold resin 2 enclosing the semiconductor chip, an electrode 3 partly enclosed in the mold resin 2 and partly exposed in the opening 5 of the mold resin 2, and an electrode terminal 4 separated from the electrode 3 and bonded to the electrode 3 by metal bonding and the like such as solder bonding, US bonding, or Ag bonding. The semiconductor chip, not illustrated, is electrically connected to the electrode 3.

The mold resin 2 is, for example, a rectangular having six planes and has a plurality of rectangular openings 5. The openings 5 are provided in a pair of opposing sides on the upper surface of the mold resin 2, respectively. The openings 5 have a shape open to the upper surface of the mold resin 2 and to the side surfaces adjacent to the upper surface and including the above-mentioned sides.

Although two openings 5 are provided in the present embodiment, for example, two or more openings may be provided. Also, the opening 5 may be provided at any positions in the mold resin 2. Although the openings 5 may have a rectangular shape when viewed from above the module as illustrated in FIG. 1, the shape may be changed to a semicircular shape, a polygonal shape or the like according to the shape of the electrode terminal 4.

The opening 5 have a bottom surface 6. The bottom surface 6 has, for example, a surface parallel to the upper surface of mold resin 2 and is positioned between the upper surface and bottom surface of mold resin 2. An electrode electrically connected to the semiconductor chip are exposed on the bottom surface 6. In other words, in the opening 5, the electrode 3 is locally exposed with a step provided at a portion of the electrode 3 of the semiconductor module 1.

The opening 5 may have a tapered shape such that the cross-sectional area on the plane parallel to the electrode 3 increases in the direction from the bottom surface 6 toward the outside of the mold resin 2. Alternatively, the opening 5 may have a straight shape such that the cross-sectional area of the plane parallel to the electrode 3 in the direction from the bottom surface 6 toward the outside of the mold resin 2 is constant.

The electrode terminal 4 has a plurality of projections 7, 8 in a contact portion 9 that covers the electrode 3 and is located inside the opening 5 and contacts the electrode 3. In FIG. 1, the electrode terminals 4 are similarly connected to the two openings 5 provided in mold resin 2, respectively. Here, the projections 7 represent the first projections, and the projection 8 represents the second projection. However, the terms first and second herein do not indicate the functional order of priority or the like of the configuration and are merely for distinguishing the projections being constituent elements. The electrode terminal 4 will be described in more detail with reference to FIG. 2. As illustrated in FIG. 1, the electrode terminal 4 has a screw hole 10 at an end portion different from the side in contact with the electrode 3.

Figure 2:
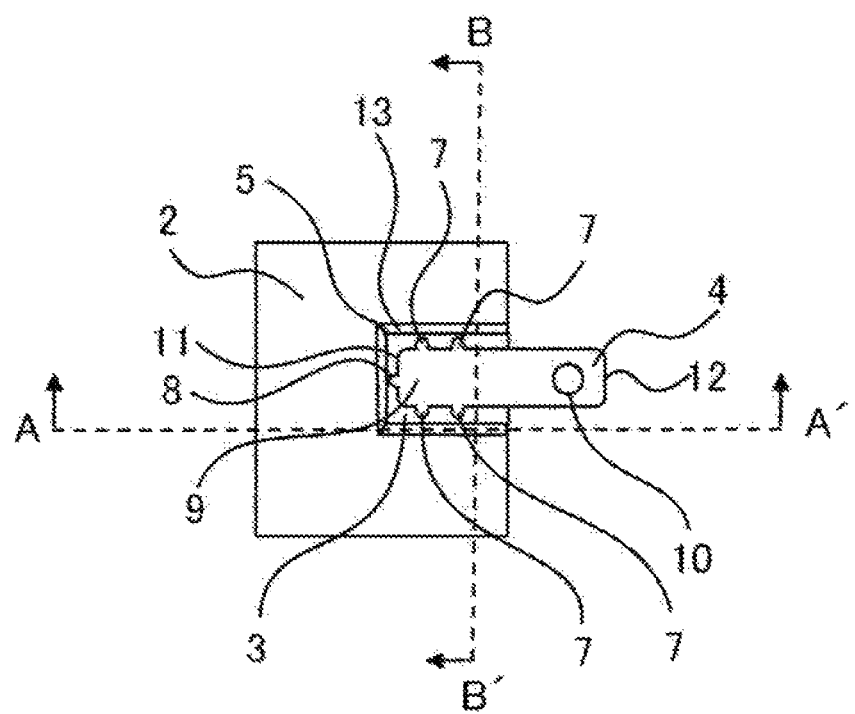
FIG. 2 is an enlarged plan view of an electrode terminal of the semiconductor device according to the first embodiment.

FIG. 2 is an enlarged plan view of the opening 5 and the electrode terminal 4 connected to the electrode 3 exposed in the opening 5 of the semiconductor device 1 according to the first embodiment. As illustrated in FIG. 2, the electrode terminal 4 has a contact portion 9 that covers the electrode 3 and is in electrical contact with the electrode 3. Also, the electrode terminal 4 has a contact end portion 11 having the contact portion 9 and an open end portion 12 which is an end portion different from the contact end portion 11. A plurality of first projections 7 are formed so as to surround the contact portion 9 and are provided between a side surface 13 of the opening 5 and the contact portion 9. Also, the plurality of first projections 7 are provided at both ends of the contact portion 9 in the width direction of the electrode terminal 4, respectively.

The electrode terminal 4 is provided with the second projection 8 at the contact end portion 11 of the contact portion 9. Although FIG. 2 illustrates an example in which two first projections 7 are provided at both ends of the electrode terminal 4 in the width direction thereof, and one second projection 8 is provided at the contact end portion 11, the numbers of the first projections 7 and the second projections 8 are not limited thereto. For example, clearance around the electrode terminal 4 may be secured by providing one first projection 7 at each end of the electrode terminal 4 in the width direction thereof without providing any second projection 8. Clearance of 10 μm or more between the side surface 13 of the opening 5 and the contact portion 9 can be secured by the first projections 7 and the second projection 8.

Accordingly, the electrode terminal 4 can be precisely positioned and mounted with respect to the electrode 3 by external form bonding between the side surface of the opening 5 and the electrode terminal 4 having the projection, by providing the electrode terminal 4 with the first projections 7 and the second projection 8. In addition, this allows solder, which is a bonding material, to creep up the side surface.

Further, as illustrated in FIG. 2, the electrode terminal 4 has the screw hole 10 (through hole) in the open end portion 12 for connecting the semiconductor device 1 to a higher system. As a method of connecting the semiconductor device 1 to the higher system with the open end portion 12, a pattern that does not have a screw hole 10, such as Ultrasonic (US) bonding, welding, or bonding using a bonding material may be adoptable, in addition to screwing.

Figure 3:
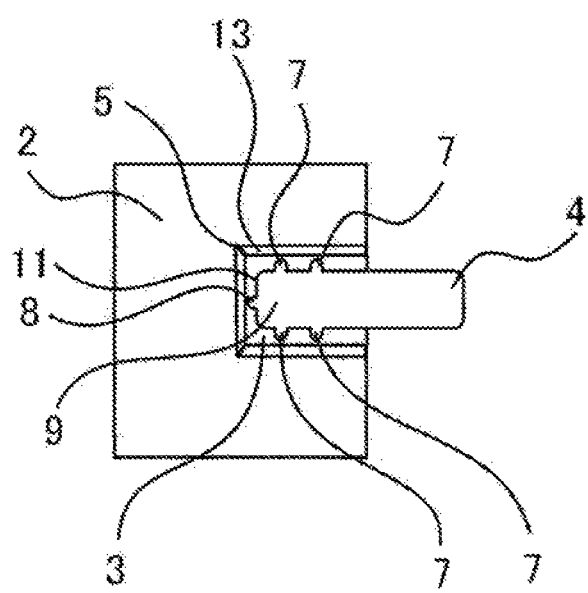
FIG. 3 is a modification of an electrode terminal in the semiconductor device according to the first embodiment.

FIG. 3 illustrates a modification of an electrode terminal 4 according to the first embodiment. FIG. 3 is a diagram in which the screw hole 10 illustrated in FIG. 2 is omitted. The electrode terminal 4 is configured as illustrated in FIG. 3 when US bonding, welding, or bonding, with a bonding material, the open end portion 12 to connect the semiconductor device 1 to the higher system. In this case, the screw hole 10 illustrated in FIG. 2 can be omitted, and the manufacturing process of the electrode terminal 4 can be simplified.

Figure 4:
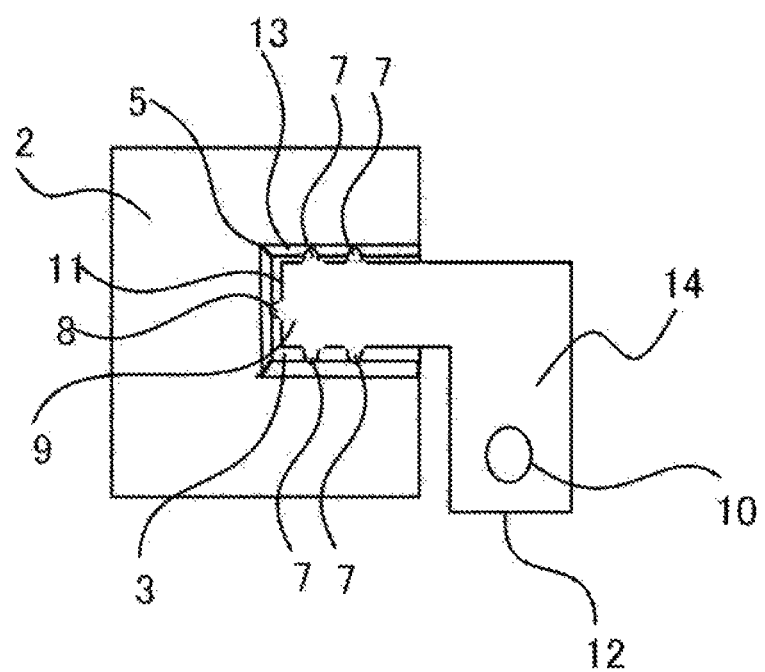
FIG. 4 is a modification of an electrode terminal in the semiconductor device according to the first embodiment.

FIG. 4 illustrates a modification of the electrode terminal 4 according to the first embodiment. As illustrated in FIG. 4, an electrode terminal 14 has an open end portion 12 extending in a direction different from that of the electrode terminal in the contact portion 9 on the extending surface of the electrode terminal 14. This allows fixing of the three-dimensional position (x, y, z) of the electrode terminal which secures the positional precision of the open end portion 12 connected to the higher system, therefore; electrode terminals of various shapes and sizes different from the rectangular electrode terminal 4 can be freely laid out, for example.

Figure 5:
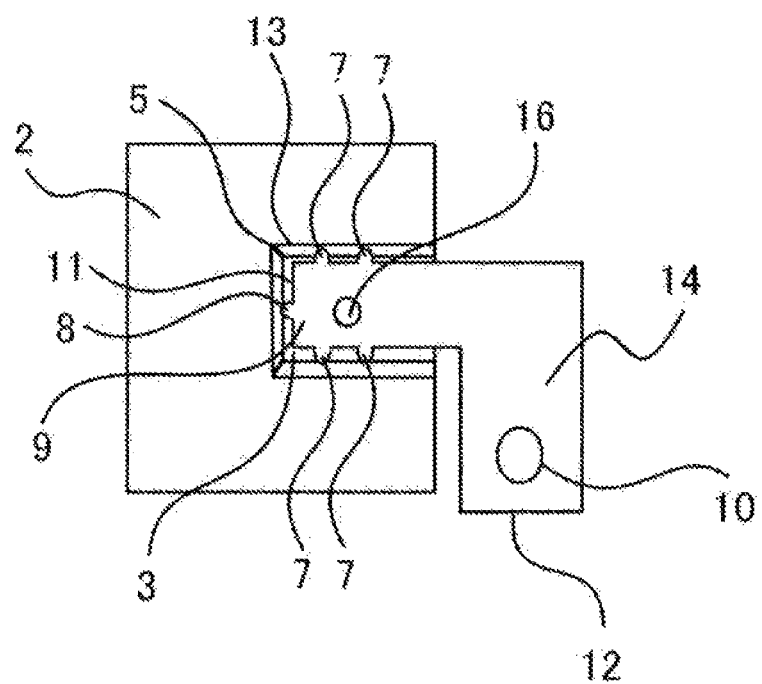
FIG. 5 is a modification of an electrode terminal in the semiconductor device according to the first embodiment.

FIG. 5 illustrates a modification of an electrode terminal 4 according to the first embodiment. As illustrated in FIG. 5, an electrode terminal 14 may have a through hole 16 in the contact portion 9. Note that the number of through holes 16 is not limited to one, and a plurality of through holes may be provided. Further, the shape of the through hole 16 is not limited to a circular shape, and a rectangular shape or a shape defined by quadratic curves may also be adoptable. By providing the through hole 16, the bondability between the electrode terminal 14 and the electrode 3 by a bonding material such as solder improves, and checking of bonded or non-bonded is ensured.

Figure 6:
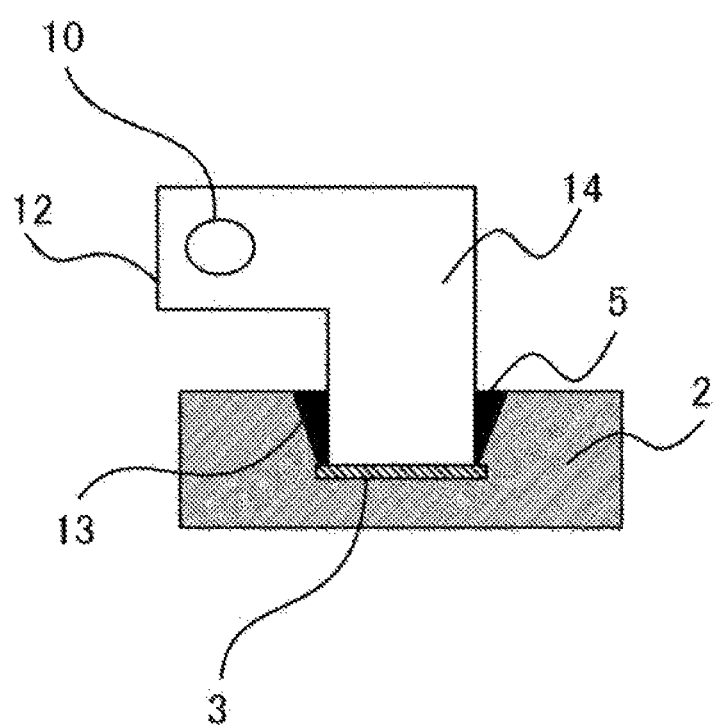
FIG. 6 is a modification of an electrode terminal in the semiconductor device according to the first embodiment.
Figure 7:
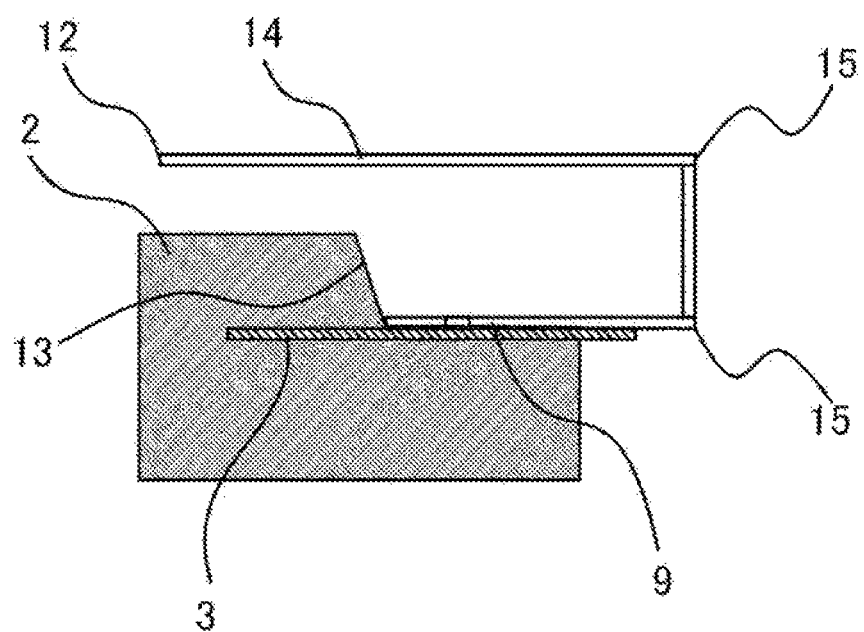
FIG. 7 is a modification of an electrode terminal in the semiconductor device according to the first embodiment.

FIGS. 6 and 7 illustrate modifications of electrode terminals according to the first embodiment. More specifically, in FIG. 6, the open end portion 12 side of the electrode terminal 14 illustrated in FIG. 4 is bent upward. FIG. 6 is a diagram of the semiconductor device 1 in FIG. 4 as viewed from the outside of the mold resin 2 in the extension direction of the electrode terminal 14 in the contact portions 9.

FIG. 7 is a diagram illustrating a modification in which an electrode terminal 14 illustrated in FIG. 6 is further bent so as to be above the upper surface of the mold resin 2 and cover the electrode 3. FIG. 7 illustrates a cross section of one of the sides of the electrode 3 parallel to the extending direction of the electrode terminal 14 in the contact portion 9, for the better view of the bent electrode terminal 14. Specifically, FIG. 6 illustrates a cross section corresponding to the A-A' cross section in FIG. 2.

In FIG. 7, an electrode terminal 14 has two bent portions 15 so that the open end portion 12 is located on the upper surface of the contact portion 9. As illustrated in FIG. 7, two bent portions 15 are configured so as to be provided between the contact portion 9 of the electrode terminal 14 and the open end portion 12 and each bent portion 15 is bent by about 90° so that the open end portion 12 is to be located on the upper surface of the contact portion 9. An example of the bent portions 15 is not limited thereto, and it may be bent so that the open end portion 12 is located on the lower surface of the contact portion 9.

By bending the electrode terminals 14 in any direction as illustrated in FIGS. 6 and 7, the free layout of the open end portions 12 of the electrode terminals 14 is ensured, and disposition of the electrode terminal mounting portions on the upper surface of the transfer mold power module is also ensured.

Typically, a transfer mold power module is used as a connected module in which a plurality of modules of the same type are connected, the positions and size of the terminals are fixed since they are molded with a mold, which makes freedom of layout difficult to implement. Therefore, when the electrode position of the module is changed, the change of the shape of the transfer mold power module is also required, which creates restrictions such as changing the shapes of the mold and the frame and requires reviewing the entire manufacturing process.

According to the present embodiment, the electrode terminals of the power module are separated from the electrodes, and the separated electrode terminals are retrofitted to the electrodes with high precision, thereby providing a semiconductor device that makes the changing of the electrode positions of the module facilitated.

Figure 8:
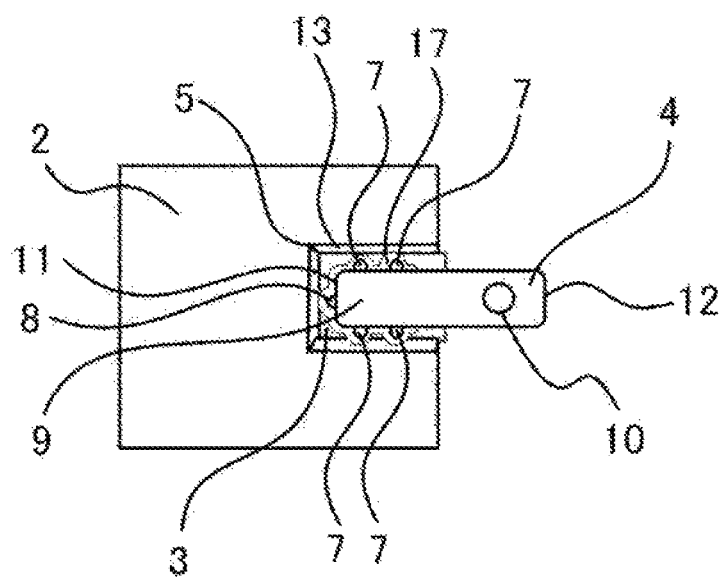
FIG. 8 is a diagram illustrating a bonded portion of the electrode terminal according to the first embodiment.
Figure 9:
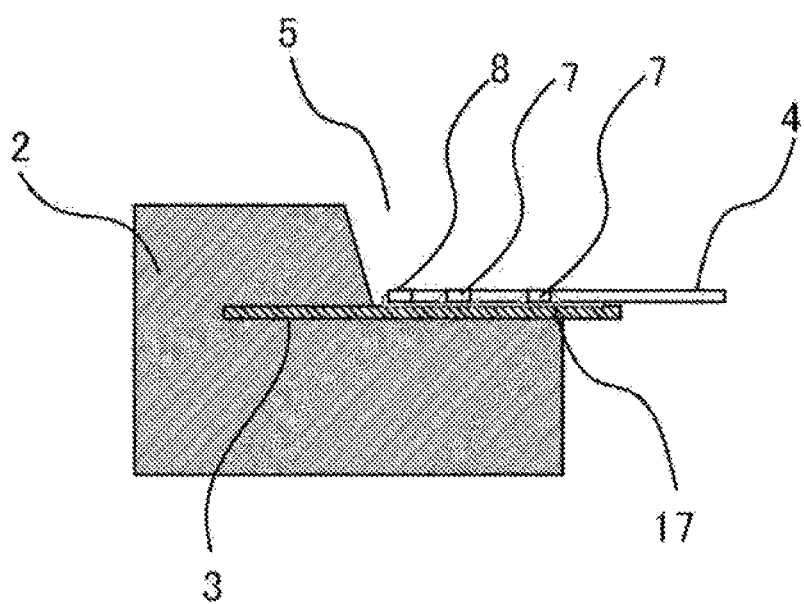
FIG. 9 is a diagram illustrating the bonded portion of the electrode terminal according to the first embodiment.

FIGS. 8 and 9 illustrate bonding portions of the electrode terminal 4 according to the first embodiment. As illustrated in FIG. 8, when the electrode terminal 4 is bonded to the electrode 3, they are adhered with an adhesive 17 such as solder or solvent. The adhesive 17 exudes between the first projections 7 and the second projection 8 and the side surface 13 of the opening 5 and on the surface of the electrode 3. The electrode terminal 4 can be metal-bonded, such as US bonding. However, in bonding with solder, a conductive adhesive, or the like, gas components of solvent or the like can easily be discharged since a clearance is formed between the side surface 13 of the opening 5 and the electrode terminal 4 due to the projections. In addition, a fillet of the bonding material can be formed on the side surface of the electrode terminal 4, thereby ensuring improvement in the bonding strength. In the quality check of the terminal bonding, in terms of the deviation of mounting positions between the electrode terminal 4 and the electrode 3 or the like, the positions of the first projections 7 and the second projection 8 need only be checked by automatic visual examination. As a result, recognizability is improved and judgment is facilitated, so that the number of man-hours for manufacturing a semiconductor device can be reduced.

Figure 10:
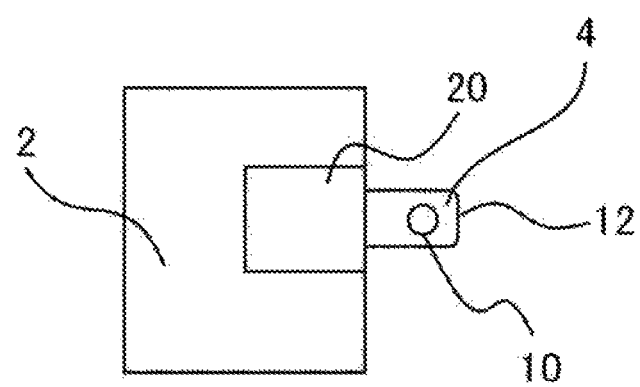
FIG. 10 is a diagram illustrating a sealed state of an opening with a sealant in the first embodiment.

FIG. 10 is a diagram illustrating the opening 5 sealed with a sealant 20 as a modification of the first embodiment. After bonding the electrode terminal 4 to the electrode 3, they are embedded in the opening 5 with a sealant 20 such as gel or resin. This ensures insulation between the bonded portion between the electrode terminal 4 and the electrode 3 and the outside, and further improvement in the quality and functionality. In addition, this ensures also facilitating product design in which the creepage and spatial insulation of the electrode terminal 4 are maintained.

Second Embodiment

Figure 11:
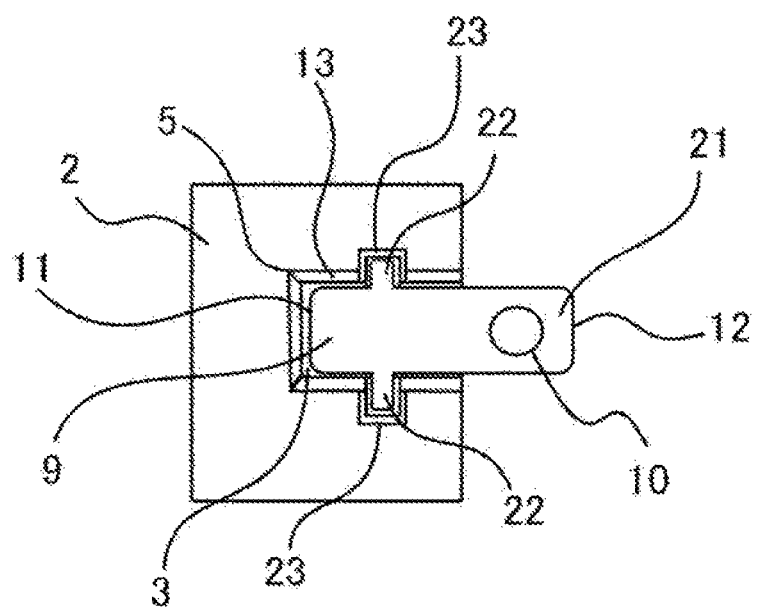
FIG. 11 is an enlarged view of an electrode terminal of a semiconductor device according to a second embodiment.

FIG. 11 is a diagram illustrating a semiconductor device according to a second embodiment. More specifically, FIG. 11 is an enlarged view of an electrode terminal 21 of the semiconductor device according to the second embodiment. In FIG. 11, the same reference numerals are assigned for the constituent elements corresponding to those in the first embodiment. As illustrated in FIG. 11, the electrode terminal 21 according to the second embodiment has third projections 22 at both ends of electrode terminal 21 in the width direction thereof in the contact portion 9.

concave portions 23 are provided at positions corresponding to the third projections in the side surface 13 of the opening 5. That is, the opening 5 has the concave portions 23 on both sides of the electrode terminal 21 in the width direction thereof of the contact portion 9. Further, the third projections 22 and the concave portions 23 are engaged with each other.

The opening 5 has the concave portions 23 that engage with the third projections 22; therefore, the positioning precision of the electrode terminal 21 to the electrode 3 further improves. Although the third projections 22 and the concave portions 23 have a rectangular shape in the second embodiment, the shape thereof is not limited thereto. Further, by making the size of the third projections 22 smaller than that of the concave portions 23, the insertion of the electrode terminal 21 into the opening 5 becomes smoother, thereby improving productivity.

Figure 12:
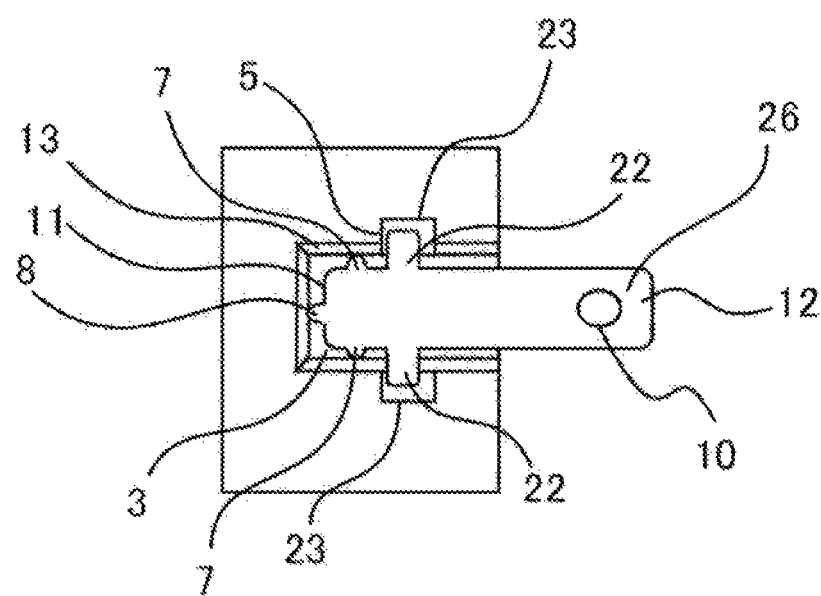
FIG. 12 is a diagram illustrating a bonded portion of the electrode terminal according to the second embodiment.

FIG. 12 illustrates a modification of an electrode terminal according to the second embodiment. FIG. 12 is a diagram in which the first projections 7 and the second projection 8 described in the first embodiment are provided to the electrode terminal 21 illustrated in FIG. 11. More specifically, an electrode terminal 26 illustrated in FIG. 12 has the first projections 7 at both ends in the width direction of the electrode terminal 26, and further has the second projection 8 at the contact end portion 11 of the electrode terminal 26, in the contact portion 9. Although in the present disclosure, an example in which two first projections 7 and one second projection 8 are provided to the contact portion 9 is illustrated, the number of projections may be more than this.

By having the first projections 7 and the second projection 8 between the side surface 13 of the opening 5 and the contact portion 9 in addition to the third projections 22 engaging with the concave portions 23, the positioning precision of the electrode terminal 26 to the electrode 3 further improves.

Third Embodiment

Figure 13:
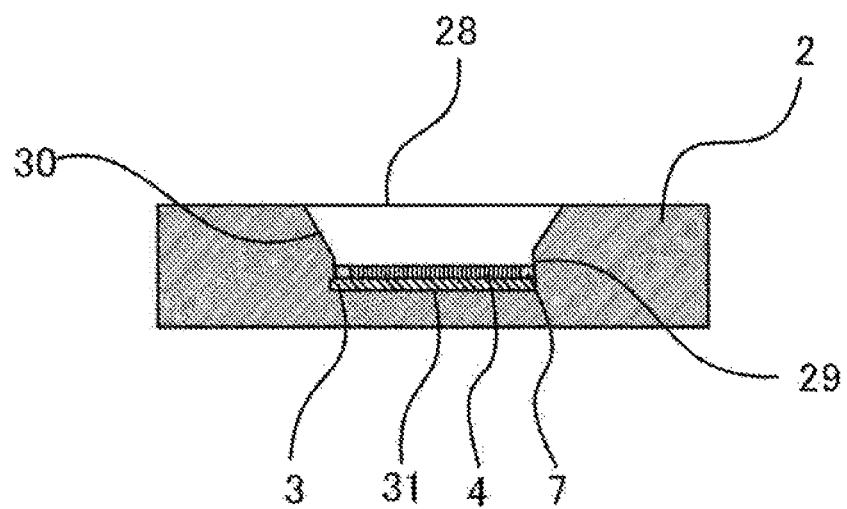
FIG. 13 is a view illustrating a cross-section of an opening of a semiconductor device according to a third embodiment.

FIG. 13 illustrates a cross section of an opening of a semiconductor device according to a third embodiment. More specifically, FIG. 13 is a diagram corresponding to the cross section of the semiconductor device taken along line B-B' illustrated in FIG. 2. However, the shape of the opening 5 illustrated in FIG. 2 is different in FIG. 13. In addition, in the constituent elements illustrated in the third embodiment, the same reference numerals as those in the first or second embodiment indicate the same constituent elements, and thus the description thereof is omitted.

As illustrated in FIG. 13, an opening 28 has a straight portion 29 in which the cross section of the opening 28 is constant in the direction from the bottom portion 31 of the opening 28 toward the outside of the mold resin 2, and a tapered portion 30 in which the cross section of the opening 28 increases in the direction from the straight portion 29 toward the outside of the mold resin 2. Here, the cross section of the opening 28 refers to a plane parallel to the electrodes 3 and the electrode terminals 4.

The depth of the straight portion 29 is greater than the thickness of the electrode 3, for example. Here, the depth of the straight portion 29 is the distance from the bottom portion 31 in the thickness direction of the electrode 3 or the electrode terminal 4. The opening of the transfer mold power module has a normal mold molding draft angle; therefore, the draft angle corresponds to the tapered portion 30.

The depth of the straight portion 29 can be set to, for example, about 1 mm. Also, the angle of the tapered portion 30 with respect to the vertical direction can be set at for example. Also, a gap between the electrode terminal 4 and the straight portion 29 can be set to about 0 to 5 μm. Thus, by providing the straight portion 29 and the tapered portion 30 in the opening 28, the positioning precision of the electrode terminal 4 to the opening 28 with the first projections 7, the second projection 8 and the third projections 22 improves.

Fourth Embodiment

Figure 14:
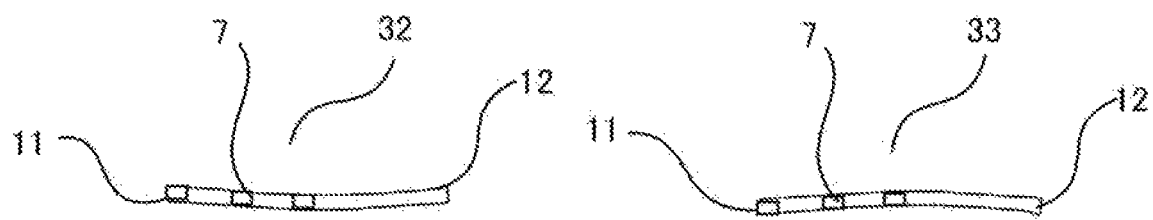
FIG. 14 is a diagram illustrating electrode terminals according to a fourth embodiment.

FIG. 14 is a diagram of electrode terminals according to a fourth embodiment. As illustrated in FIG. 14, the electrode terminals are not flat, that is, they are not formed on the same plane, but curved upward or downward in the extending direction of the electrode terminals. That is, the electrode terminal 32 is curved so as to protrude downward in the extending direction of the electrode terminal. Meanwhile, the electrode terminal 33 is curved so as to protrude upward in the extending direction of the electrode terminal 33. Upward, here, refers to the side different from the electrode 3 when the electrode terminals 32 and 33 are installed on the electrode 3. In addition, in the constituent elements illustrated in the fourth embodiment, the same reference numerals as those in the first or third embodiment indicate the same constituent elements, and thus the description thereof is omitted.

Also, although not illustrated in FIG. 14, the electrode terminals 32 and 33 have a curved shape that protrudes downward in the width direction of the electrode terminal. That is, in the electrode terminals 32 and 33, at least the cross section of the contact portion 9 has a convex carved shape toward the electrode 3 in the width direction of the electrode terminals. It should be noted that the convex carved shape may extend over the entire extending direction of the electrode terminals 32 and 33 in addition to the portion of the contact portion 9. The cross-sectional shape of the electrode terminals 32 and 33 will be described later with reference to FIG. 16.

As illustrated in FIG. 14, by bonding not only a flat electrode terminal but also a pre-curved electrode terminal (convex or concave) to the electrode 3, a fuse effect at the junction can be obtained. For example, if a short circuit occurs inside the module for some reason in a state where the module is installed in a facility or the like, the temperatures of the electrode terminals 32 and 33 rise to a high level, and the solder bonding the electrode terminals 32 and 33 melts. As a result, the electrode terminals 32 and 33 per se spring up due to the repulsion of the electrode terminals 32 and 33 that have been bent and warped in advance, and the state of bonding with the electrode 3 is cancelled, thereby leading to the electrical disconnection between the electrode 3 and the electrode terminals 32 and 33. The thickness of, for example, 0.4 mm to 2 mm can be adoptable for the electrode terminals 32 and 33.

Figure 15:
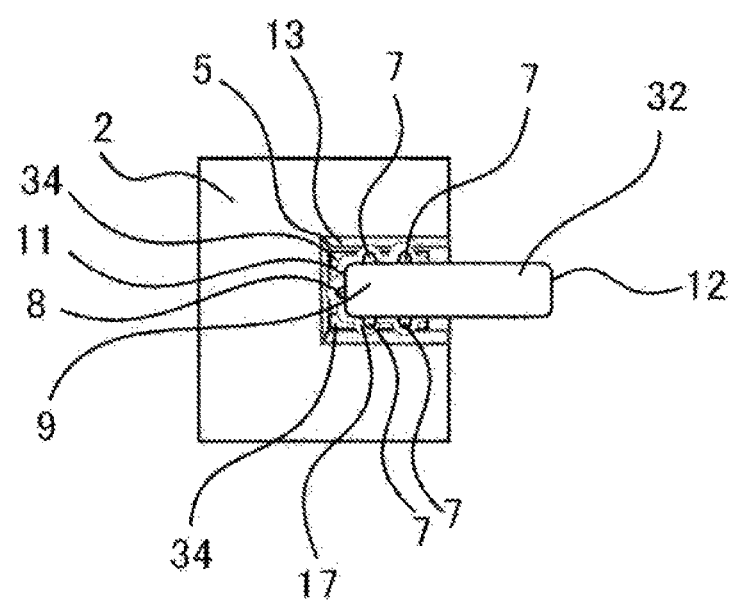
FIG. 15 is an enlarged diagram illustrating the electrode terminal according to the fourth embodiment.
Figure 16:
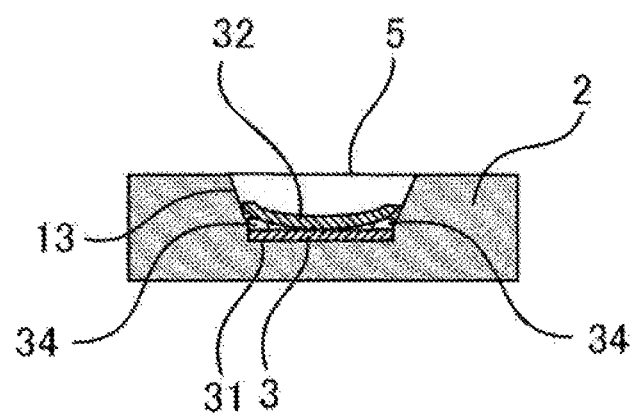
FIG. 16 is an enlarged diagram illustrating the electrode terminal according to the fourth embodiment.

FIGS. 15 and 16 are enlarged views of the electrode terminal according to the fourth embodiment. FIG. 16 illustrates a cross section of an opening of the semiconductor device according to the fourth embodiment. More specifically, FIG. 16 is a diagram corresponding to the cross section of the semiconductor device taken along line B-B' illustrated in FIG. 2. In FIGS. 15 and 16, the electrode terminal 32 is illustrated as an electrode terminal that is curved so as to protrude downward in the extending direction of the electrode terminal. However, the electrode terminal 33 is not limited to this, and may be a curved electrode terminal 33 that protrudes upward with respect to the extending direction of the electrode terminal.

As illustrated in FIGS. 15 and 16, a step portion 34 is provided between the electrode 3 and both ends of the contact portion 9 in the width direction thereof of the electrode terminals 32. The step portion 34 is provided, for example, between the first projections 7 and the electrode 3, and has a rectangular shape that extends in the extending direction of the electrode terminal 32 with a certain thickness. The step portion 34 may be made of the same material as the mold resin 2, or may be made of a conductor used for an electrode or the like. Accordingly, by providing the step portion 34 inside the opening 5, that is, between both ends of the electrode terminal 32 in the width direction and the electrode 3, clearance can be secured between the electrode terminal 32 and the electrode 3 in advance, which allows a configuration in which, when a short circuit occurs, the terminal comes off responsively, that is, disconnection is prompted. The thickness of the step portion 34 can be 0.05 mm to 1.00 mm.

Fifth Embodiment

Figure 17:
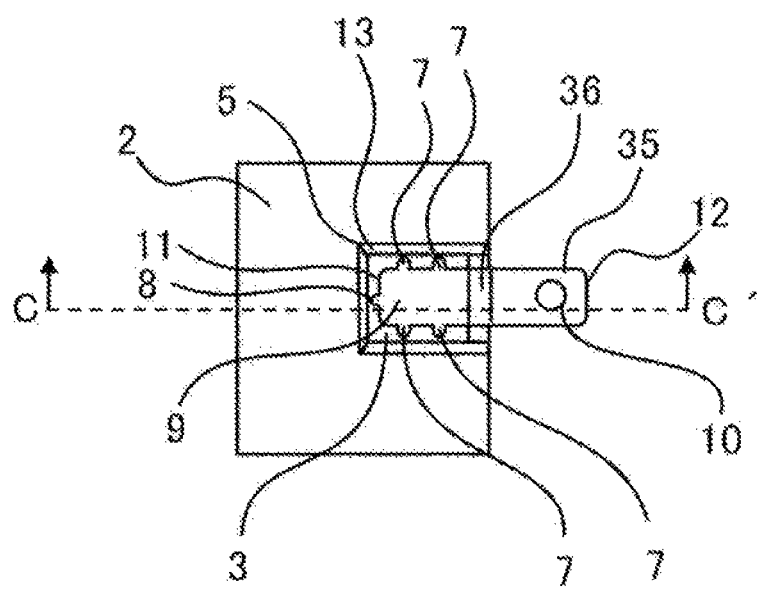
FIG. 17 is an enlarged diagram illustrating an electrode terminal according to a fifth embodiment.
Figure 18:
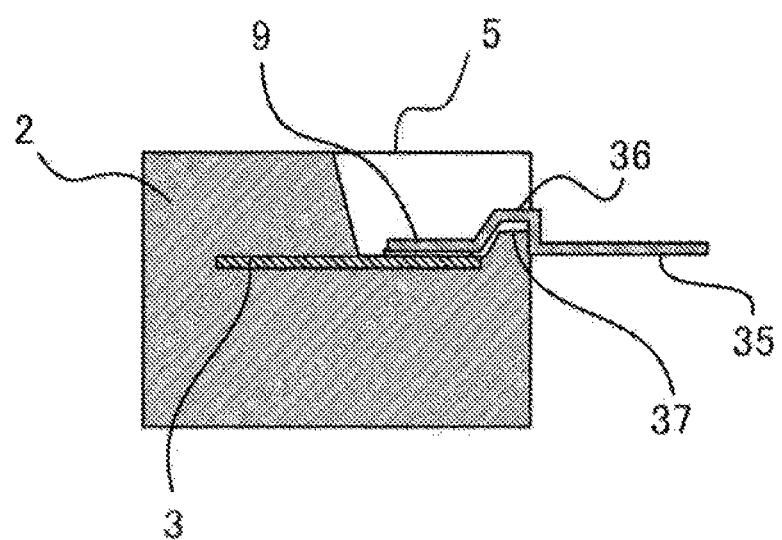
FIG. 18 is a diagram illustrating the electrode terminal according to the fifth embodiment.

FIG. 17 is a diagram of an electrode terminal 35 according to a fifth embodiment. FIG. 18 is a diagram corresponding to the C-C' cross section in FIG. 17. That is, FIG. 18 is a diagram illustrating cross sections of the mold resin 2, the opening 5, and the electrode terminal 35. As illustrated in FIGS. 17 and 18, the electrode terminal 35 has a convex portion 36 between the contact portion 9 and the open end portion 12 of the electrode terminal 35. In addition, in the constituent elements illustrated in the fifth embodiment, the same reference numerals as those in the first to fourth embodiment indicate the same constituent elements, and thus the description thereof is omitted.

Further, as illustrated in FIG. 18, the mold resin 2 has a step projection 37 that engages with the convex portion 36. The convex portion 36 of the electrode terminal 35 is formed by bending the electrode terminal. With the convex portion 36 being provided in the electrode terminal 35, positioning of the convex portion 36 and the step projection 37 that engages therewith is conducted. The step projection 37 is formed, for example, such that a portion of the mold resin is formed into a convex shape along the end portion of the electrode 3; therefore, the precision thereof is high. Accordingly, the positioning precision of the electrode terminal 35 to the electrode 3 further improves.

Sixth Embodiment

Figure 19:
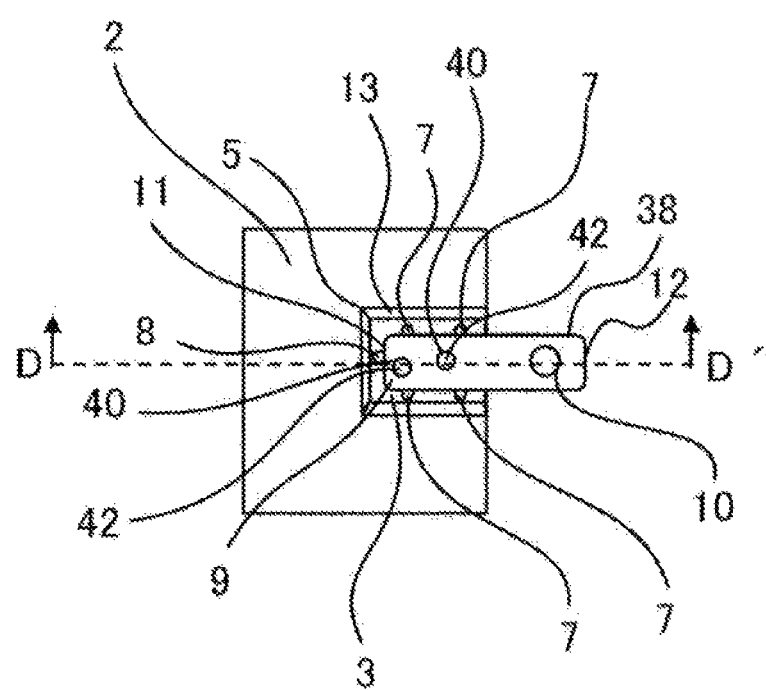
FIG. 19 is an enlarged diagram illustrating an electrode terminal according to a sixth embodiment.
Figure 20:
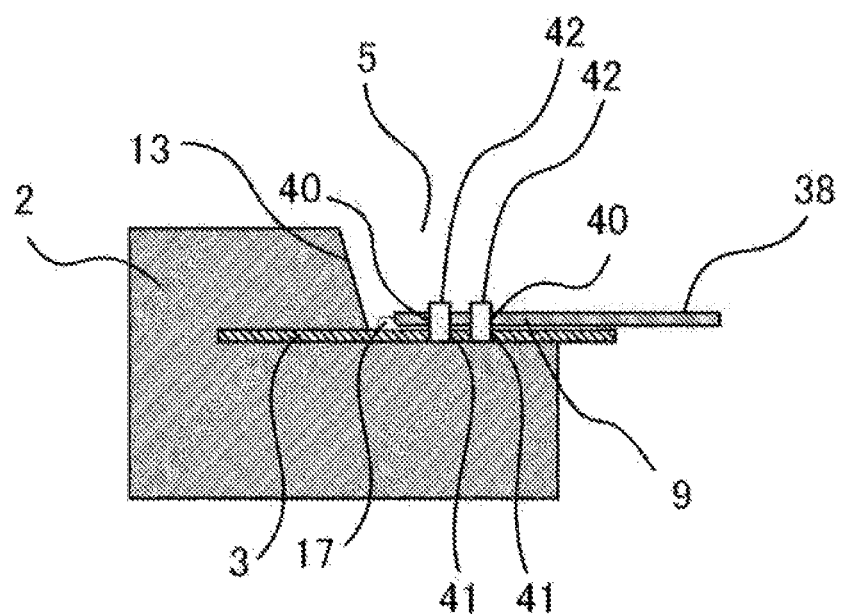
FIG. 20 is a diagram illustrating a cross-section of the electrode terminal according to the sixth embodiment.

FIGS. 19 and 20 are diagrams illustrating an electrode terminal 38 according to a sixth embodiment. FIG. 20 illustrates a cross section of the mold resin 2, the opening 5 and the electrode terminal 38 corresponding to the cross section D-D' of FIG. 19. The sixth embodiment differs from the previous embodiments in that the electrode and electrode terminal have through holes, and that through projections that extend through the through holes are provided. In addition, in the constituent elements illustrated in the sixth embodiment, the same reference numerals as those in the first to fifth embodiments indicate the same constituent elements, and thus the description thereof is omitted.

As illustrated in FIG. 20, the electrode 3 has through holes 41 at positions in contact with the contact portion 9 of the electrode terminal 38. Also, the electrode terminal 38 has through holes 40 at positions corresponding to the through holes 41. That is, the through holes 40 and the through holes 41 communicate with each other in the thickness direction of the electrode 3 or the electrode terminal 38. Here, the through holes 41 are also referred to as the first through holes 41 and the through holes 40 are also referred to as the second through holes 40. The mold resin 2 is integrally formed with through projections 42 extending through the through holes 40 and the through holes 41. Thereby, the positioning precision of the electrode terminal 38 with respect to the electrode 3 further improves.

Although as illustrated in FIGS. 19 and 20, the through holes 40 and 41 and the through projections 42 extending through the through holes are provided at two locations, any number of them may be provided without being limited thereto. For example, by providing two or more through holes and corresponding through projections, suppression of the displacement of the electrode terminal 38 on the electrode 3, particularly the rotation of the electrode terminal within the plane of the electrode terminal 38 is ensured, further improving the positioning precision of the electrode terminal 38 with respect to the electrode 3.

Figure 21:
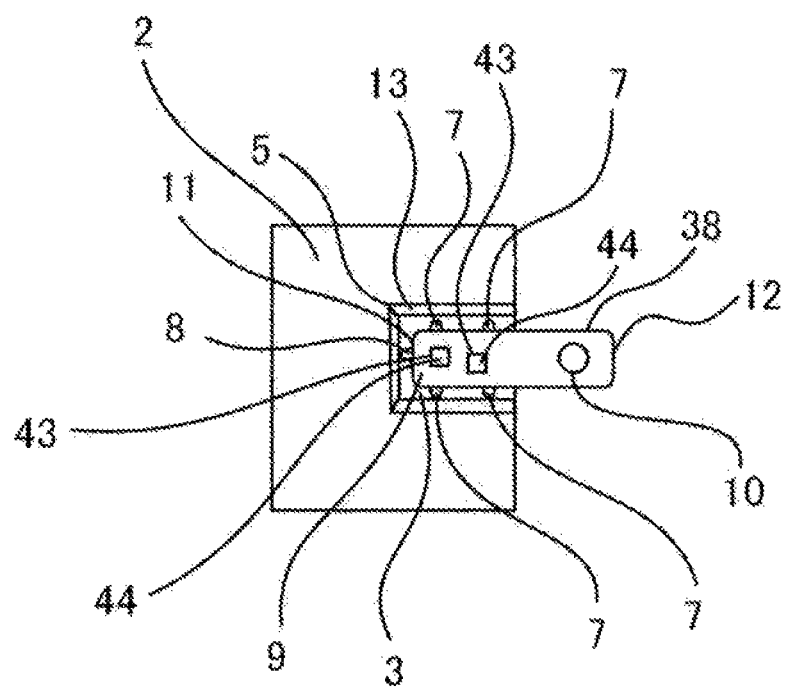
FIG. 21 is a modification of the electrode terminal according to the sixth embodiment.

FIG. 21 is a modification of the through hole and the through projection according to the sixth embodiment. FIGS. 19 and 20 illustrate a configuration in which the through holes 40 and 41 and the corresponding through projections 42 are circular, however, as illustrated in FIG. 21, through hole 43 provided in the electrode terminal 38 and the corresponding through projection 44 may be rectangular. Although not illustrated, in this case, the through hole provided in the electrode 3 is also rectangular desirably.

Figure 22:
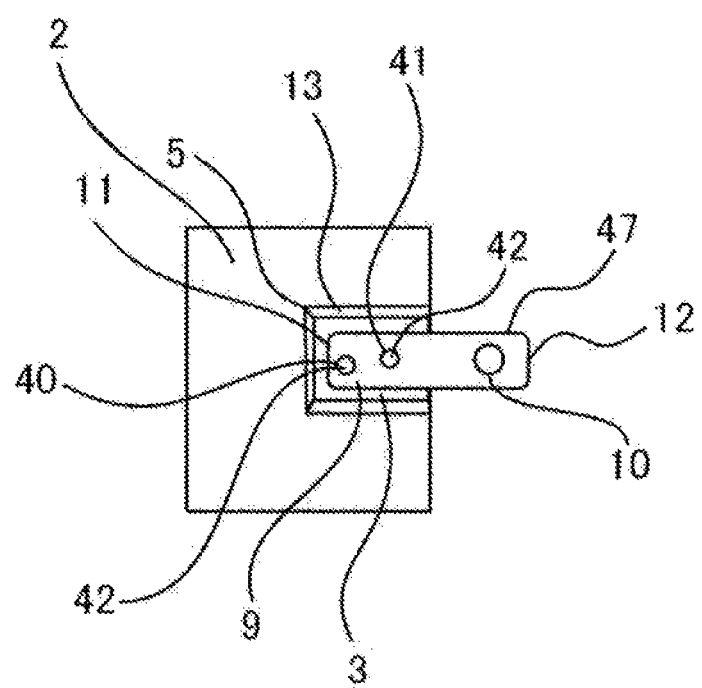
FIG. 22 is a modification of the electrode terminal according to the sixth embodiment.
Figure 23:
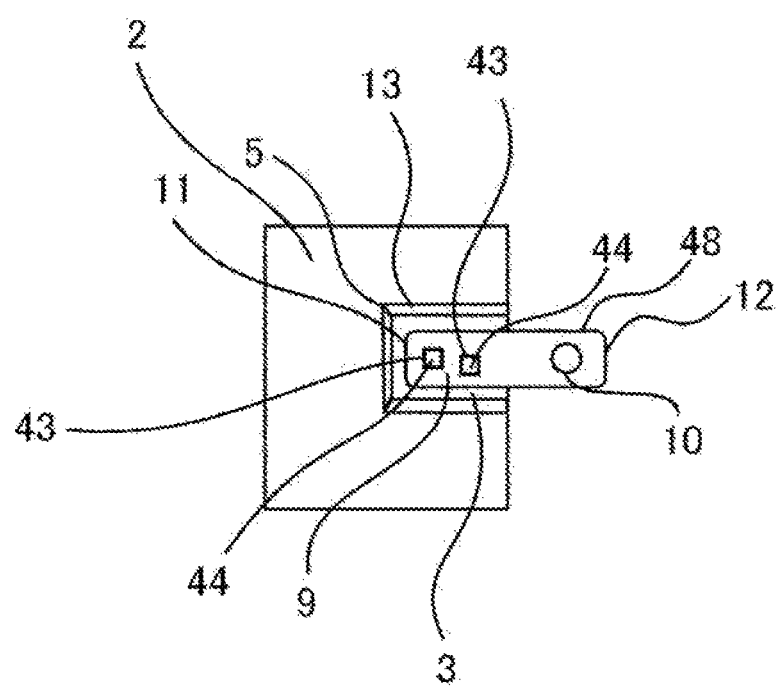
FIG. 23 is a modification of the electrode terminal according to the sixth embodiment.

FIGS. 22 and 23 are diagrams illustrating electrode terminals according to the sixth embodiment. FIGS. 22 and 23 omit the first projections 7 and the second projection 8 in FIGS. 19 and 21, respectively. With regard to constituent elements other than them, the same reference numerals indicate the same constituent elements. That is, in FIG. 22, an electrode terminal 47 that does not have the first projections 7 and the second projection 8 is bonded to the electrode 3. The electrode terminal 47 has a circular through hole 41.

That is, in FIG. 23, an electrode terminal 48 that does not have the first projections 7 and the second projection 8 is bonded to the electrode 3. And the electrode terminal 48 has a rectangular through hole 43. In FIGS. 22 and 23, the through holes of the electrode 3 corresponding to the through holes 41 and 43 and the shape of the through projections integrally provided in the mold resin 2 are the same as those in FIGS. 19 and 20; therefore, the description there of is omitted.

As illustrated in FIGS. 22 and 23, by omitting the first projections 7 and the second projection 8, the positioning precision of the electrode terminals 47 and 48 is secured and the manufacturing process of the electrode terminals 47 and 48 is simplified, ensuring the reduction of the manufacturing cost of the semiconductor device.

Seventh Embodiment

Figure 24:
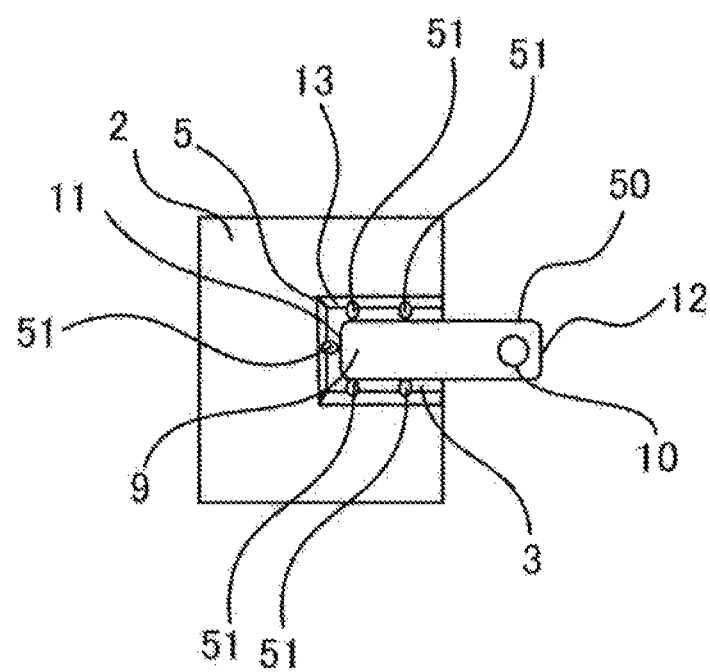
FIG. 24 is an enlarged diagram illustrating an electrode terminal according to a seventh embodiment.

FIG. 24 is an enlarged diagram illustrating an electrode terminal 50 according to a seventh embodiment. As illustrated in FIG. 24, the electrode terminal 50 has a plurality of projections 51 formed integrally with the mold resin 2 between the side surface 13 of the opening 5 of the mold resin 2 and the contact portion 9 of the electrode terminal 50, with the first projections 7 and the second projection 8 in FIG. 2 being omitted. In addition, in the constituent elements illustrated in the seventh embodiment, the same reference numerals as those in the first to sixth embodiments indicate the same constituent elements, and thus the description thereof is omitted.

As illustrated in FIG. 24, by providing the projections 51 on the mold resin 2, the positioning precision when the electrode terminal 50 is bonded to the electrode 3 can be secured in the same manner as when the electrode terminal 50 is provided with projections. Also, an electrode terminal without the projections can be used. The distance between the opening 5 and the electrode terminal 50 is secured by the projections 51. The distance can be set to 10 μm, for example.

Eighth Embodiment

Figure 25:
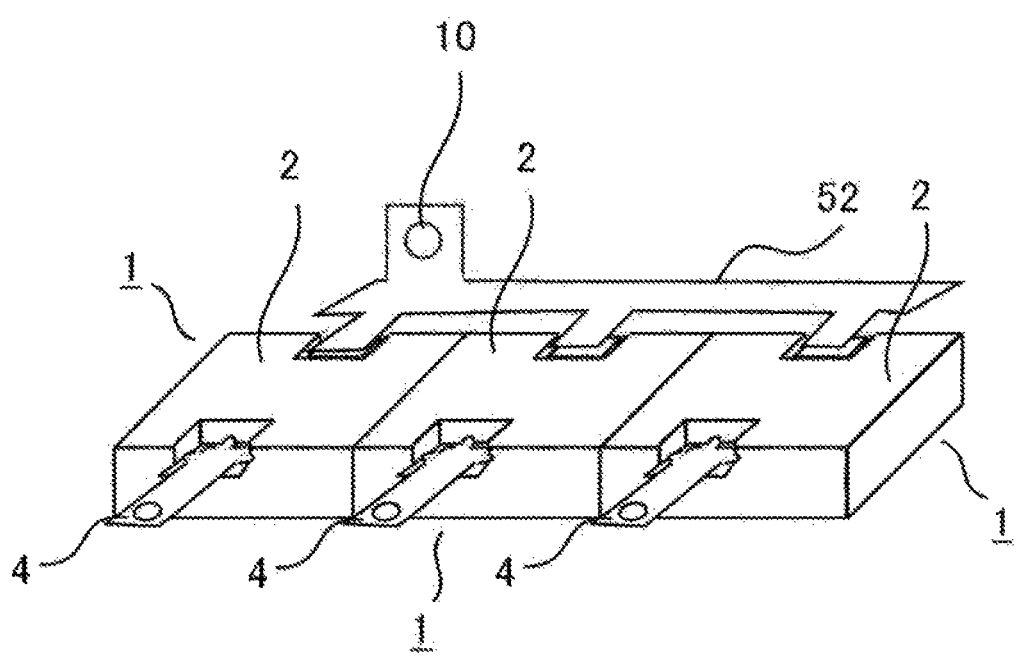
FIG. 25 is a diagram illustrating a semiconductor device group according to an eighth embodiment.

FIG. 25 is a diagram illustrating a semiconductor device group according to an eighth embodiment. As illustrated in FIG. 25, a configuration when connecting and using a plurality of transfer mold power modules as semiconductor devices is illustrated. In addition, in the constituent elements illustrated in the eighth embodiment, the same reference numerals as those in the first to seventh embodiments indicate the same constituent elements, and thus the description thereof is omitted.

The plurality of semiconductor devices 1 are electrically connected to each other with a connecting electrode terminal 52 in which the open end portions of the electrode terminals are connected, respectively. The connecting electrode terminal 52 has a screw hole 10 and is electrically connected to a higher system. With this configuration, the capacity of the transfer mold power modules can be increased. Although FIG. 25 illustrates an example in which three semiconductor devices 1 are connected in parallel in one direction, the present invention is not limited thereto, and three or more semiconductor devices may be connected in parallel.

Although in the first to eighth embodiments, an example in which the semiconductor device is a transfer mold module has been described, the present invention is not limited thereto, and can be applied to a case type module structure, for example.

Ninth Embodiment

In present embodiment, the semiconductor device according to the above-described first to seventh embodiments is applied to a power conversion apparatus.

Although the application of the present invention is not limited to a specific power conversion apparatus, hereinafter, as the ninth embodiment, a case where the present invention is applied to a three-phase inverter will be described.

FIG. 26 is a block diagram illustrating a configuration a power conversion system to which a power conversion apparatus of the ninth embodiment is applied.

The power conversion system illustrated in FIG. 26 includes a power supply 100, a power conversion apparatus 200, and a load 300. The power supply 100 is a DC power supply and supplies DC power to the power conversion apparatus 200. The power supply 100 can be configured with various components, for example, the configuration thereof may include a DC system, a solar cell, and a storage battery, or include a rectifier circuit connected to an AC system or an AC/DC converter. Further, the power supply 100 may be configured by a DC/DC converter that converts the DC power output from the DC system into a predetermined power.

The power conversion apparatus 200 is a three-phase inverter connected between the power supply 100 and the load 300, which converts the DC power supplied from the power supply 100 into AC power and supplies AC power to the load 300. As illustrated in FIG. 26, the power conversion apparatus 200 includes a main conversion circuit 201 that converts DC power into AC power and outputs thereof, and a control circuit 203 that outputs a control signal for controlling the main conversion circuit 201 to the main conversion circuit 201.

The load 300 is a three-phase electric motor driven by AC power supplied from the power conversion apparatus 200. The load 300 is not limited to a specific application, and is an electric motor mounted on various electric devices. For example, the load 300 is used as an electric motor for a hybrid vehicle, an electric vehicle, a railroad vehicle, an elevator, or an air conditioning apparatus.

Hereinafter, the detailed description is made on the power conversion apparatus 200. The main conversion circuit 201 includes a switching element and a freewheeling diode (not illustrated), and by switching the switching element, the DC power supplied from the power supply 100 is converted into AC power and supplied thereof to the load 300. There are various specific circuit configurations of the main conversion circuit 201, and the main conversion circuit 201 according to the present embodiment is a two-level three-phase full bridge circuit, and has six switching elements and six freewheeling diodes each of which is anti-parallel with the respective switching elements.

Each switching element and each freewheeling diode of the main conversion circuit 201 is configured by a semiconductor device 202 corresponding to any of the above-described embodiments 1 to 8. Each of the two switching elements of the six switching elements connected in series constitutes an upper and lower arm, and each upper and lower arm constitutes each phase (U-phase, V-phase, W-phase) of the full bridge circuit. Then, the output terminal of each upper and lower arm, that is, the three output terminals of the main conversion circuit 201, are connected to the load 300.

Further, the main conversion circuit 201 includes a drive circuit (not illustrated) for driving each switching element, and the drive circuit may be built in the semiconductor device 202, or a configuration in which the drive circuit is provided separately from the semiconductor device 202 may be adoptable. The drive circuit generates a drive signal for driving the switching element of the main conversion circuit 201 and supplies the drive signal to the control electrode of the switching element of the main conversion circuit 201. Specifically, in response to the control signal from the control circuit 203 described later, a drive signal for turning on the switching element and a drive signal for turning off the switching element are output to the control electrode of each switching element. When the switching element is kept in the ON state, the drive signal is a voltage signal (ON signal) equal to or higher than a threshold voltage of the switching element, and when the switching element is kept in the OFF state, the drive signal is a voltage signal (OFF signal) equal to or lower than the threshold voltage of the switching element.

The control circuit 203 controls the switching elements of the main conversion circuit 201 so that the desired power is supplied to the load 300. Specifically, the control circuit 203 calculates the time (ON time) for each switching element of the main conversion circuit 201 to be in the ON state based on the power to be supplied to the load 300.

For example, the main conversion circuit 201 is controlled by PWM control that modulates the ON time of the switching elements according to the voltage to be output. Then, a control command (control signal) is output to the drive circuit provided in the main conversion circuit 201 so that an ON signal is output to the switching element supposed to be turned on at each time point and an OFF signal is output to the switching element supposed to be turned off. The drive circuit outputs an ON signal or an OFF signal as a drive signal to the control electrode of each switching element according to the control signal.

In the power conversion apparatus according to the present embodiment, the semiconductor devices according to the first to eighth embodiments are applied as the switching elements and the freewheeling diodes of the main conversion circuit 201; therefore, even if there is a change in the electrode position of the module, the entailing cost and the like for the change can be avoided.

Although in the present embodiment, the example where the present invention is applied to the two-level three-phase inverter has been described, the present invention is not limited there to, and can be applied to various power conversion apparatuses. Although in the present embodiment, a two-level power conversion apparatus is adopted, a three-level or multi-level power conversion apparatus may also be adoptable, and when power is supplied to a single-phase load, the present invention may also be adopted to a single-phase inverter. Further, when supplying power to a DC load or the like, the present invention is adoptable to the DC/DC converter or the AC/DC converter.

Further, the power conversion apparatus to which the present invention is applied is not limited to the case where the above-mentioned load is an electric motor, the power conversion apparatus can be applied to the case where a load is a power supply device for an electric discharge machine, a laser machine, an induction heating cooker, or a contactless power supply system, further applied to the case where a load is a power conditioner for a solar power generation system and a power storage systems, for example.

In the drawings described above, the same reference numerals denote the same or corresponding constituent elements, and this is common throughout the specification. In addition, the present disclosure can be arbitrarily combined, modified, or omitted as appropriate within the scope of the disclosure. Also, although the embodiments of the present disclosure have been described above, the present disclosure is not limited to the embodiments.

While the invention/disclosure has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor chip;
   a mold resin enclosing the semiconductor chip;
   an electrode electrically connected to the semiconductor chip and exposed in an opening provided in the mold resin; and
   an electrode terminal having a contact portion that covers the electrode and is in electrical contact with the electrode, a plurality of projections formed to surround the contact portion and provided between a side surface of the opening and the contact portion, a contact end portion having the contact portion and an open end portion which is a different end portion from the contact end portion.

2. The semiconductor device according to claim 1, wherein
   the projections include a plurality of first projections provided at both ends of the contact portion in a width direction of the electrode terminal.

3. The semiconductor device according to claim 2, wherein
   the electrode terminal further includes a second projection provided at the contact end portion.

4. The semiconductor device according to claim 1, wherein
   the projections include third projections provided at the contact portion of the electrode terminal, and
   the opening has concave portions with which the third projections engage.

5. The semiconductor device according to claim 1, wherein
   the opening has
   a straight portion in which a cross section of the opening is constant in a direction from a bottom portion of the opening toward the outside of the mold resin, and
   a tapered portion in which a cross section of the opening increases in the direction from the straight portion toward the outside of the mold resin.

6. The semiconductor device according to claim 1, wherein
   the electrode terminal has a through hole in the contact portion.

7. The semiconductor device according to claim 1, wherein
   the electrode terminal has a through hole on a side of the open end portion.

8. The semiconductor device according to claim 1, wherein
   the electrode terminal has bent portions which are bent at the side of the open end portion,
   the open end portion is located on an upper surface or a lower surface of the contact portion.

9. The semiconductor device according to claim 1, wherein
   in the electrode terminal, a cross section of the contact portion in a width direction of the electrode terminal has a convex carved shape toward the electrode.

10. The semiconductor device according to claim 9, further comprising
    a step portion between both ends of the contact portion of the electrode terminal in a width direction and the electrode.

11. The semiconductor device according to claim 1, wherein
    the electrode terminal has a shape protruding upward or downward in an extending direction of the electrode terminal.

12. The semiconductor device according to claim 1, wherein
    the opening and a contact portion of the electrode and the electrode terminal are sealed with a sealant.

13. The semiconductor device according to claim 1, wherein
    the electrode has a first through hole,
    the electrode terminal has a second through hole communicating with the first through hole in the contact portion, and
    the mold resin has a through projection extending through the first through hole and the second through hole.

14. The semiconductor device according to claim 1, wherein
    the electrode terminal has a convex portion between the contact portion and the open end portion, and
    the mold resin has a step projection that engages with the convex portion.

15. The semiconductor device according to claim 1, wherein
the electrode terminal is bonded to the electrode by any of US bonding, welding, and a bonding material.

16. The semiconductor device according to claim 1, wherein
the semiconductor device is a transfer mold module.

17. A semiconductor device group comprising a plurality of semiconductor devices according to claim 1, wherein
one connecting electrode terminal is configured with the open end portion of the electrode terminal of each of the semiconductor devices being connected to the open end portions of the electrode terminals of other semiconductor devices, and
each of the semiconductor devices is connected in parallel with the connecting electrode terminal.

18. A power conversion apparatus comprising:
a main conversion circuit including a semiconductor device according to claim 1, and configured to convert and output input power;
a drive circuit configured to output a drive signal for driving the semiconductor device to the semiconductor device; and
a control circuit configured to output a control signal for controlling the drive circuit to the drive circuit.

19. A semiconductor device comprising:
a semiconductor chip;
a mold resin enclosing the semiconductor chip;
an electrode electrically connected to the semiconductor chip and exposed in an opening provided in the mold resin; and
an electrode terminal having a contact portion that covers the electrode and is in electrical contact with the electrode, a contact end portion having the contact portion and an open end portion which is a different end portion from the contact end portion, wherein
the mold resin has a plurality of projections between a side surface of the opening and the contact portion of the electrode terminal.

* * * * *